United States Patent
Ravi et al.

(10) Patent No.: US 10,840,923 B2
(45) Date of Patent: Nov. 17, 2020

(54) APPARATUS, SYSTEM AND METHOD OF GENERATING A FREQUENCY OUTPUT WITH A DIGITALLY CONTROLLED RING OSCILLATOR (DCRO)

(71) Applicant: INTEL IP CORPORATION, Santa Clara, CA (US)

(72) Inventors: Ashoke Ravi, Hillsboro, OR (US); Rotem Banin, Even Yehuda (IL); Ofir Degani, Haifa (IL); David Ben-Haim, Shoham (IL); Yigal Kalmanovich, Haifa (IL)

(73) Assignee: INTEL IP CORPORATION, Santa Clara, CA (US)

( * ) Notice: Subject to any disclaimer, the term of this patent is extended or adjusted under 35 U.S.C. 154(b) by 0 days.

(21) Appl. No.: 16/329,312

(22) PCT Filed: Sep. 29, 2016

(86) PCT No.: PCT/US2016/054392
§ 371 (c)(1),
(2) Date: Feb. 28, 2019

(87) PCT Pub. No.: WO2018/063231
PCT Pub. Date: Apr. 5, 2018

(65) Prior Publication Data
US 2019/0253058 A1    Aug. 15, 2019

(51) Int. Cl.
*H04L 7/08*    (2006.01)
*H03L 7/099*    (2006.01)
(Continued)

(52) U.S. Cl.
CPC .......... *H03L 7/0995* (2013.01); *H03L 7/093* (2013.01); *H04L 7/0331* (2013.01); *H04L 7/08* (2013.01); *H03L 2207/50* (2013.01)

(58) Field of Classification Search
CPC ... H03L 7/0995; H03L 7/093; H03L 2207/50; H04L 7/0331; H04L 7/08
See application file for complete search history.

(56) References Cited

U.S. PATENT DOCUMENTS 9,137,084 B2    9/2015   Degani et al.
2004/0251973 A1*  12/2004  Ishida ............... H03K 3/0315
                                                    331/16
(Continued)

FOREIGN PATENT DOCUMENTS

WO    2014194308    12/2014

OTHER PUBLICATIONS

International Preliminary Report on Patentability for International Application No. PCT/US2016/054392, dated Apr. 11, 2019, 7 pages.
(Continued)

Primary Examiner — Dac V Ha
(74) Attorney, Agent, or Firm — Shichrur & Co.

(57) ABSTRACT

For example, a digital PLL may include a digitally controlled Ring Oscillator (DCRO) configured to generate a frequency output based on a control signal, the DCRO comprising a plurality of stages in a cyclic order, a first stage of the plurality of stages comprising a plurality of inverter modules controlled by the control signal and comprising a plurality of outputs that drive inputs of a plurality of second stages in the plurality of stages; a decoder to decode a phase of the DCRO based on a plurality of sampled phases of the plurality of stages of the DCRO; and a phase error estimator to estimate a phase error based on the phase of the DCRO and a frequency control word, the control signal is based on the phase error.

25 Claims, 8 Drawing Sheets

(51) Int. Cl.
    *H03L 7/093*   (2006.01)
    *H04L 7/033*   (2006.01)

(56) References Cited

U.S. PATENT DOCUMENTS

| | | | |
|---|---|---|---|
| 2006/0001496 A1* | 1/2006 | Abrosimov | H03K 3/0322 331/57 |
| 2007/0182493 A1* | 8/2007 | Sai | H03L 7/0995 331/2 |
| 2016/0173119 A1* | 6/2016 | Ponton | H03M 1/662 375/219 |
| 2017/0117907 A1* | 4/2017 | Grollitsch | H03L 7/0995 |
| 2018/0034468 A1* | 2/2018 | Faisal | H03L 7/0997 |
| 2019/0190525 A1* | 6/2019 | Fredenburg | H03L 7/0997 |

OTHER PUBLICATIONS

International Search Report and the Written Opinion for International Application No. PCT/US2016/054392, dated Oct. 7, 2017, 9 pages.

Nugroho P. et al: "A novel 14-bit digitally controlled ring oscillator", Electronics, Communications and Computers (JEC-ECC), 2012 Japan-Egypt Conference on, IEEE, Mar. 6, 2012 (Mar. 6, 2012), pp. 18-21, 4 pages.

Pokharel R K et al: "Digitally controlled ring oscillator using fraction-based series optimization for inductorless reconfigurable all-digital PLL", Silicon Monolithic Integrated Circuits in RF Systems (SIRF), 2011 IEEE 11th Topical Meeting on, IEEE, Jan. 17, 2011 (Jan. 17, 2011), pp. 69-72, 4 pages.

Richard Su et al: "A 2.6ps rms-period-jitter 900MHz all-digital fractional-N PLL built with standard cells", ESSCIRC (ESSCIRC), 2011 Proceedings of the, IEEE, Sep. 12, 2011 (Sep. 12, 2011), pp. 455-458, 4 pages.

R. B. Staszewski, et al., "All-Digital TX Frequency Synthesizer and Discrete-Time Receiver for Bluetooth Radio in 130-nm CMOS," IEEE J. Solid-State Circuits, pp. 2278-2291, Dec. 2004, 14 pages.

M. Straayer and M. Perrot, "A Multi-Path Gated Ring Oscillator TDC With First-Order Noise Shaping", IEEE J. Solid-State Circuits, vol. 44, No. 4, pp. 1089-1098, Apr. 2009, 10 pages.

A. Abidi, "Phase noise and jitter in CMOS ring oscillators", IEEE J. Solid-State Intel Confidential Circuits, vol. 41, No. 8, pp. 1803-1816, 2006, 14 pages.

\* cited by examiner

APPARATUS, SYSTEM AND METHOD OF GENERATING A FREQUENCY OUTPUT WITH A DIGITALLY CONTROLLED RING OSCILLATOR (DCRO)

TECHNICAL FIELD

Embodiments described herein generally relate to generating a frequency output with a Digitally Controlled Ring Oscillator (DCRO).

BACKGROUND

A fractional-N ring oscillator Digital Phase Locked Loop (DPLL) may be an attractive solution for low power dissipation, for example, for some implementations, e.g., implementations involving a receiver to scan continuously in a background, or to wake-up to perform a scan.

The fractional-N ring oscillator DPLL may include a ring oscillator to be operated at relatively low current levels. The ring oscillator may generate multiple phases required for down-conversion.

The fractional-N ring oscillator DPLL may include a time-digital converter (TDC) for measuring and digitizing a phase of the ring oscillator with sufficient resolution, e.g., a resolution of approximately 4-6 bits.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
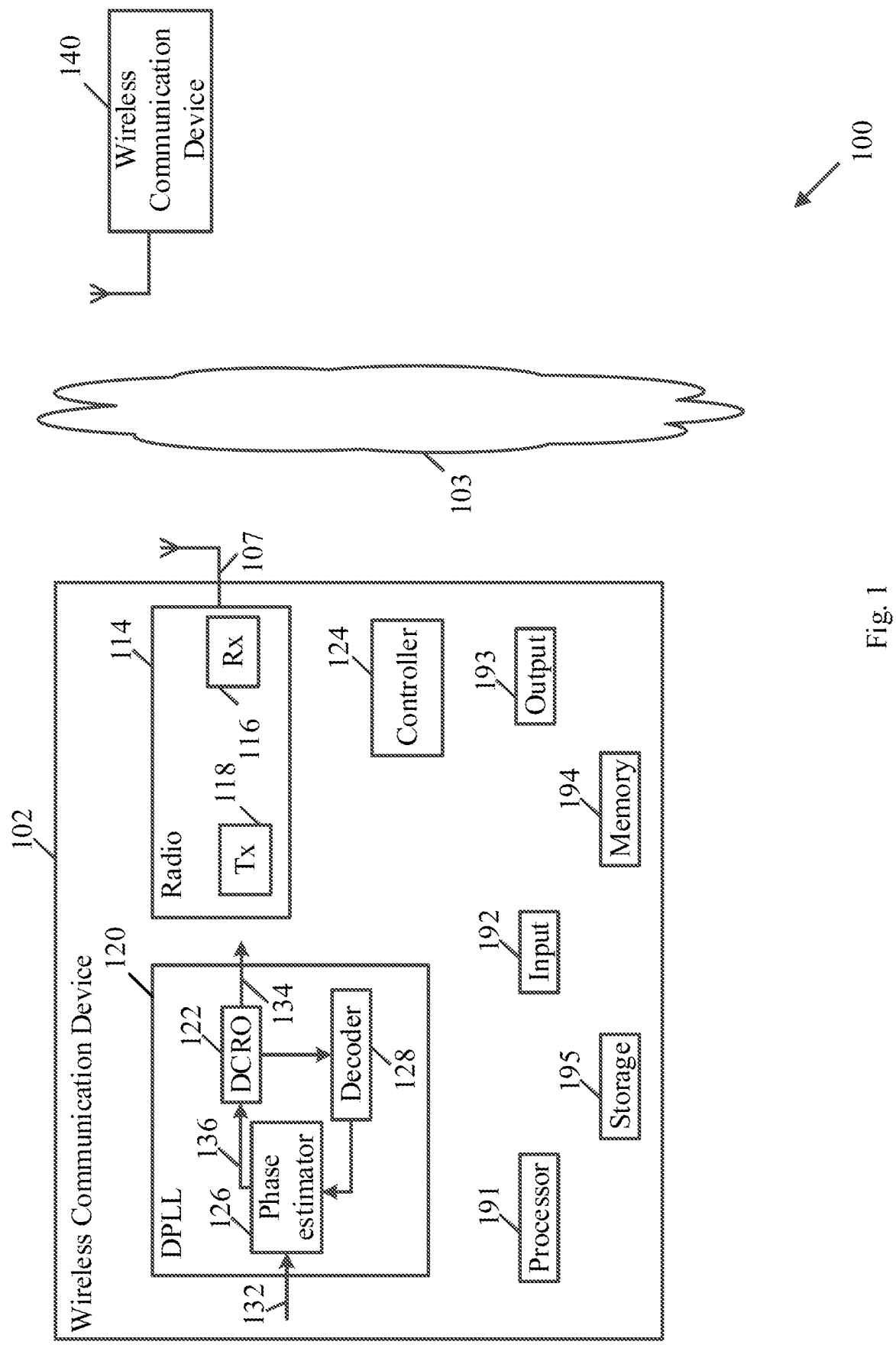
FIG. 1 is a schematic block diagram illustration of a system, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc, indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with devices and/or networks operating in accordance with existing IEEE 802.11 standards (including *IEEE 802.11-2012, IEEE Standard for Information technology—Telecommunications and information exchange between systems Local and metropolitan area networks—Specific requirements Part 11:Wireless LAN Medium Access Control (MAC) and Physical Layer (PHY) Specifications*, Mar. 29, 2012; IEEE802.11ac-2013 ("*IEEE P802.11ac-2013, IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications—Amendment 4: Enhancements for Very High Throughput for Operation in Bands below 6 GHz*", December, 2013); IEEE 802.11ad ("*IEEE P802.11ad-2012, IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications—Amendment 3: Enhancements for Very High Throughput in the 60 GHz Band*", 28 December, 2012); and/or IEEE-802.11REVmc ("IEEE 802.11-REVmc™/D3.0, June 2014 *draft standard for Information technology—Telecommunications and information exchange between systems Local and metropolitan area networks Specific requirements; Part 11: Wireless LAN Medium Access Control (MAC) and Physical Layer (PHY) Specification*"); IEEE 802.11ax (IEEE 802.11ax, *High Efficiency WLAN (HEW)*); IEEE802.11-ay (*P802.11ay Standard for Information Technology—Telecommunications and Infor-* mation Exchange Between Systems Local and Metropolitan Area Networks—Specific Requirements Part 11: *Wireless LAN Medium Access Control (MAC) and Physical Layer (PHY) Specifications—Amendment: Enhanced Throughput for Operation in License-Exempt Bands Above 45 GHz*)) and/or future versions and/or derivatives thereof, devices and/or networks operating in accordance with existing WFA Peer-to-Peer (P2P) specifications (including *WiFi P2P technical specification, version* 1.5, Aug. 4, 2014) and/or future versions and/or derivatives thereof, devices and/or networks operating in accordance with existing Wireless-Gigabit-Alliance (WGA) specifications (including *Wireless Gigabit Alliance, Inc WiGig MAC and PHY Specification Version* 1.1, April 2011, *Final specification*) and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some embodiments may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some embodiments may be used in conjunction with one or more types of wireless communication signals and/or systems, for example, Radio Frequency (RF), Infra Red (IR), Frequency-Division Multiplexing (FDM), Orthogonal FDM (OFDM), Orthogonal Frequency-Division Multiple Access (OFDMA), FDM Time-Division Multiplexing (TDM), Time-Division Multiple Access (TDMA), Multi-User MIMO (MU-MIMO), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other embodiments may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative embodiments, a wireless device may be or may include a peripheral that is integrated with a computer, or a peripheral that is attached to a computer. In some demonstrative embodiments, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device.

As used herein, the term "circuitry" may refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g. radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and/or the like. Logic may be executed by one or more processors using memory, e.g., registers, buffers, stacks, and the like, coupled to the one or more processors, e.g., as necessary to execute the logic.

The term "antenna", as used herein, may include any suitable configuration, structure and/or arrangement of one or more antenna elements, components, units, assemblies and/or arrays. In some embodiments, the antenna may implement transmit and receive functionalities using separate transmit and receive antenna elements. In some embodiments, the antenna may implement transmit and receive functionalities using common and/or integrated transmit/receive elements. The antenna may include, for example, a phased array antenna, a single element antenna, a set of switched beam antennas, and/or the like.

Some demonstrative embodiments are described herein with respect to WiFi communication. However, other embodiments may be implemented with respect to any other communication scheme, network, standard and/or protocol.

Reference is now made to FIG. 1, which schematically illustrates a block diagram of a system 100, in accordance with some demonstrative embodiments.

As shown in FIG. 1, in some demonstrative embodiments, system 100 may include one or more wireless communication devices. For example, system 100 may include a wireless communication device 102 and/or one or more wireless communication devices 140.

In some demonstrative embodiments, device 102 may include a mobile device or a non-mobile, e.g., a static, device.

In some demonstrative embodiments, wireless communication devices 102, and/or 140 may include, for example, a UE, an MD, a STA, an AP, a PC, a desktop computer, a mobile computer, a laptop computer, an Ultrabook™ computer, a notebook computer, a tablet computer, a server computer, a handheld computer, a handheld device, an Internet of Things (IoT) device, a sensor device, a wearable device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a mobile phone, a cellular telephone, a PCS device, a PDA device which incorporates a wireless communication device, a mobile or portable GPS device, a DVB device, a relatively small computing device, a non-desktop computer, a "Carry Small Live Large" (CSLL) device, an Ultra Mobile Device (UMD), an Ultra Mobile PC (UMPC), a Mobile Internet Device (MID), an "Origami" device or computing device, a device that supports Dynamically Composable Computing (DCC), a context-aware device, a video device, an audio device, an A/V device, a Set-Top-Box (STB), a Blu-ray disc (BD) player, a BD recorder, a Digital Video Disc (DVD) player, a High Definition (HD) DVD player, a DVD recorder, a HD DVD recorder, a Personal Video Recorder (PVR), a broadcast HD receiver, a video source, an audio source, a video sink, an audio sink, a stereo tuner, a broadcast radio receiver, a flat panel display, a Personal Media Player (PMP), a digital video camera (DVC), a digital audio player, a speaker, an audio receiver, an audio amplifier, a gaming device, a data source, a data sink, a Digital Still camera (DSC), a media player, a Smartphone, a television, a music player, or the like.

In some demonstrative embodiments, wireless communication device 102 may include, for example, one or more of a processor 191, an input unit 192, an output unit 193, a memory unit 194, and/or a storage unit 195. Device 102 may optionally include other suitable hardware components and/or software components. In some demonstrative embodiments, some or all of the components of one or more of device 102 may be enclosed in a common housing or packaging, and may be interconnected or operably associated using one or more wired or wireless links. In other embodiments, components of one or more of device 102 may be distributed among multiple or separate devices.

In some demonstrative embodiments, processor 191 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 191 executes instructions, for example, of an Operating System (OS) of wireless communication device 102 and/or of one or more suitable applications.

In some demonstrative embodiments, input unit 192 may include, for example, a keyboard, a keypad, a mouse, a touch-screen, a touch-pad, a track-ball, a stylus, a microphone, or other suitable pointing device or input device. Output unit 193 may include, for example, a monitor, a screen, a touch-screen, a flat panel display, a Light Emitting Diode (LED) display unit, a Liquid Crystal Display (LCD) display unit, a plasma display unit, one or more audio speakers or earphones, or other suitable output devices.

In some demonstrative embodiments, memory unit 194 may include, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 195 may include, for example, a hard disk drive, a floppy disk drive, a Compact Disk (CD) drive, a CD-ROM drive, a DVD drive, or other suitable removable or non-removable storage units. Memory unit 194 and/or storage unit 195, for example, may store data processed by wireless communication device 102.

In some demonstrative embodiments, device 102 may include and/or perform the functionality of one or more STAs. For example, device 102 may include at least one STA.

In one example, a station (STA) may include a logical entity that is a singly addressable instance of a medium access control (MAC) and physical layer (PHY) interface to a wireless medium (WM). The STA may perform any other additional or alternative functionality.

In other embodiments, device 102 may operate as and/or perform one or more functionalities of any other wireless device and/or station, e.g., a WLAN STA, a WiFi STA, and the like.

In other embodiments, device 102 may operate as, perform a role of, and/or perform one or more functionalities of, any other additional or alternative device and/or station.

In some demonstrative embodiments, wireless communication device 102 may be capable of communicating content, data, information and/or signals via a wireless medium (WM) 103. In some demonstrative embodiments, wireless medium 103 may include, for example, a radio channel, a cellular channel, a Global Navigation Satellite System (GNSS) Channel, an RF channel, a Wireless Fidelity (WiFi) channel, an IR channel, a Bluetooth (BT) channel, and the like.

In some demonstrative embodiments, wireless communication medium 103 may include a wireless communication channel over a 2.4 Gigahertz (GHz) frequency band, a 5 GHz frequency band, a millimeterWave (mmWave) frequency band, e.g., a 60 GHz frequency band, a Sub 1 Gigahertz (S1G) band, and/or any other frequency band.

In some demonstrative embodiments, device 102 may include one or more radios including circuitry and/or logic to perform wireless communication between device 102 and/or one or more other wireless communication devices. For example, device 102 may include at least one radio 114.

In some demonstrative embodiments, radio 114 may include one or more wireless receivers (Rx) including circuitry and/or logic to receive wireless communication signals, RF signals, frames, blocks, transmission streams, packets, messages, data items, and/or data. For example, radio 114 may include at least one receiver 116.

In some demonstrative embodiments, radio 114 may include one or more wireless transmitters (Tx) including circuitry and/or logic to transmit wireless communication signals, RF signals, frames, blocks, transmission streams, packets, messages, data items, and/or data.

For example, radio 114 may include at least one transmitter 118.

In some demonstrative embodiments, radio 114, transmitter 118, and/or receivers 116 may include circuitry; logic; Radio Frequency (RF) elements, circuitry and/or logic; baseband elements, circuitry and/or logic; modulation elements, circuitry and/or logic; demodulation elements, circuitry and/or logic; amplifiers; analog to digital and/or digital to analog converters; filters; and/or the like. For example, radio 114 may include or may be implemented as part of a wireless Network Interface Card (NIC), and the like.

In some demonstrative embodiments, radio 114 may be configured to communicate over a 2.4 GHz band, a 5 GHz band, a directional band, for example, an mmWave band, a S1G band, a cellular band, an LTE band, and/or any other band.

In some demonstrative embodiments, radio 114 may include, or may be associated with, one or more antennas 107.

In one example, device 102 may include a single antenna 107. In another example, device 102 may include two or more antennas 107.

Antenna 107 may include any type of antennas suitable for transmitting and/or receiving wireless communication signals, blocks, frames, transmission streams, packets, messages and/or data. For example, antenna 107 may include any suitable configuration, structure and/or arrangement of one or more antenna elements, components, units, assemblies and/or arrays. Antenna 107 may include, for example, antennas suitable for directional communication, e.g., using beamforming techniques. For example, antenna 107 may include a phased array antenna, a multiple element antenna, a set of switched beam antennas, and/or the like. In some embodiments, antenna 107 may implement transmit and receive functionalities using separate transmit and receive antenna elements. In some embodiments, antenna 107 may implement transmit and receive functionalities using common and/or integrated transmit/receive elements.

In some demonstrative embodiments, wireless communication device 102 may include a controller 124 configured to perform one or more communications, to generate and/or communicate one or more messages and/or transmissions, and/or to perform one or more functionalities, operations and/or procedures between device 102 and one or more other devices, e.g., as described below.

In some demonstrative embodiments, controller 124 may include circuitry and/or logic, e.g., one or more processors including circuitry and/or logic, memory circuitry and/or logic, Media-Access Control (MAC) circuitry and/or logic, Physical Layer (PHY) circuitry and/or logic, and/or any other circuitry and/or logic, configured to perform the functionality of controller 124. Additionally or alternatively, one or more functionalities of controller 124 may be implemented by logic, which may be executed by a machine and/or one or more processors, e.g., as described below.

In one example, controller 124 may include circuitry and/or logic, for example, one or more processors including circuitry and/or logic, to cause, trigger and/or control a wireless device, e.g., device 102, and/or a wireless station, e.g., a wireless STA implemented by device 102, to perform one or more operations, communications and/or functionalities, e.g., as described herein. In some demonstrative embodiments, at least part of the functionality of controller 124 may be implemented by an integrated circuit, for example, a chip, e.g., a System on Chip (SoC). In one example, the chip or SoC may be configured to perform one or more functionalities of radio 114. For example, the chip or SoC may include one or more elements of controller 124, and/or one or more elements of radio 114. In one example, controller 124, and radio 114 may be implemented as part of the chip or SoC.

In other embodiments, controller 124 and/or radio 114 may be implemented by one or more additional or alternative elements of device 102.

In some demonstrative embodiments, a low power operation and a small area may be critical Key Performance Indicators (KPIs) of a performance of some wireless communication devices.

In some demonstrative embodiments, for example, in some use cases, implementations and/or scenarios, a phase noise or a jitter of a local oscillator (LO) may be relaxed. For example, requirements for phase noise or jitter of an LO may be relaxed, for example, when operating in a beacon mode, e.g., a keep-alive mode, for example, in a WiFi network, performing radar detection over a wireless channel, e.g., for 160 MHz or 80+80 MHz WiFi channel bonding, performing a discovery procedure in Bluetooth/Bluetooth Low Energy (BLE) network, waking-up receivers for IoT and/or wearable devices, and/or in one or more additional or alternative use cases, scenarios, or implementations.

In some demonstrative embodiments, for example, in some use case, implementations, and/or scenarios, a receiver may scan the WM in order to detect a signal presence of a specific signature.

In some demonstrative embodiments, detecting the signal presence of the specific signature may involve a simple demodulation with relaxed Signal to Noise Ratio (SNR) requirements.

However, the receiver may be required to continuously perform the scanning, e.g., in the "background", to frequently wake up to perform the scanning, and/or to perform any additional or alternative procedure, e.g., in order to detect the signal presence of the specific signature.

In some demonstrative embodiments, additional hardware and/or power reduction modes may be added to a main radio receiver, e.g., in order to enable selectively operating the receiver a reduced power.

In some demonstrative embodiments, LO generation and distribution may contribute to a power dissipation of the receiver. For example, the receiver may use inductor-capacitor (LC) oscillator based Phase Locked Loops (PLLs) for their superior phase noise performance. However, typical LC-oscillators may not be operated at extremely low voltages and currents, e.g., due to start-up issues and an impedance of practical on-chip inductors.

In some demonstrative embodiments, a fractional-N ring oscillator Digital PLL (DPLL) may provide an efficient mechanism to generate a frequency signal.

In some demonstrative embodiments, the fractional-N ring oscillator DPLL may be operated at very low current levels, which may, for example, reduce the power dissipation of the receiver.

For example, a fractional-N ring oscillator DPLL may be implemented as a compact circuit and closely integrated with the receiver, and/or receiver mixers, for example, to reduce the power dissipation of the receiver in a GHz LO distribution.

In some demonstrative embodiments, the fractional-N ring oscillator DPLL may support generation of multiple LO phases, e.g., a sufficient number of phases, e.g., which may be required for down-conversion.

In some demonstrative embodiments, in some use cases, scenarios or implementations, it may not be advantageous to implement a fractional-N ring oscillator DPLL including a time-digital converter (TDC) to measure and digitize a phase of the LO, e.g., as described below. For example, the TDC may be able to measure and digitize the phase of the oscillator with a resolution of approximately 4-6 bits.

For example, the TDC may require implementing one or more additional delay lines and flip-flops, which may result in an overhead of area and power, e.g., for achieving a sufficiently fine delay in order to not limit a phase quantization noise. For example, the TDC may use one or more additional delay lines to compare time shifted versions of the oscillator against a reference clock, or vice-versa. For example, the one or more additional delay lines of the TDC may require calibration against an instantaneous oscillation frequency of the oscillator, e.g., in order to obtain phase information. For example, the one or more delay lines of the TDC may require calibration against the instantaneous frequency of the oscillator across process, voltage, temperature, and/or frequency changes. These requirements for the TDC may result in a cumbersome implementation and may require extra circuitry.

In some demonstrative embodiments, device 102 may implement a DPLL 120, e.g., a fractional-N ring oscillator DPLL, which may be configured to provide improved performance, for example compared to a DPLL utilizing a TDC, e.g., as described below.

In some demonstrative embodiments, DPLL 120 may be configured to provide at least high frequency, a sub-gate delay resolution, low power operation, and/or one or more additional or alternative benefits and/or improvements, e.g., as described below.

In some demonstrative embodiments, at least part of the functionality of DPLL 120 may be implemented by an integrated circuit, for example, a chip, e.g., a SoC.

In some demonstrative embodiments, DPLL may be implemented as part of one or more wireless communication components of device 102, for example, as part of radio 114, transmitter 118, and/or receiver 116. In one example, DPLL 120 may be implemented as part of a chip or SoC, e.g., including one or more elements of radio 114 and/or controller 124.

In other embodiments, DPLL 120 may be implemented by one or more additional or alternative elements of wireless communication device 102, for example, as part of processor 191.

In some demonstrative embodiments, DPLL 120 may be configured to avoiding a use of one or more components of the TDC, e.g., as described below. In one example, eliminating the use of the TDC may allow to avoid a power dissipation and area of a TDC. In another example, avoiding the use of the TDC may avoid a need for additional circuitry for measuring and calibrating a delay of the TDC against the oscillation frequency.

In some demonstrative embodiments, DPLL 120 may be configured to generate one or more frequency signals to be provided to one or more components of wireless communication device 102, e.g., as described below.

In one example, DPLL 120 may generate one or more frequency signals to be provided to one or more components of radio 114. In another example, DPLL 120 may generate one or more frequency signals to be provided, for example, a clock of processor 191.

In some demonstrative embodiments, DPLL 120 may include an oscillator configured to produce a periodic oscillating signal, e.g., as described below.

In some demonstrative embodiments, for example, in some use cases, implementations and/or scenarios, a ring oscillator may provide one or more improved KPIs for wireless communication.

In one example, a ring oscillator may be implemented on a relatively small area, and may operate at very low power dissipation, e.g., to eliminate start-up issues.

In another example, a ring oscillator may eliminate the power dissipation of an LO distribution, for example, when the ring oscillator is placed in close proximity to receiver mixers.

In another example, a ring oscillator may be configured to generate phases, for example, quadrature or multiple phases, which may be suitable, for example, for receiver mixers.

In some demonstrative embodiments, for example, in some use cases, and/or scenarios, requirements for gate delay, tuning range, and/or jitter may limit a number of stages of the ring oscillator. For example, a ring oscillator may utilize three to five stages, for example, to provide an output signal in a GHz range.

In some demonstrative embodiments, for example, in some use cases, implementations, and/or scenarios, a limited number of stages of the ring oscillator may be insufficient, for example, to achieve a required phase quantization resolution and/or to fulfill one or more additional or alternative requirements. For example, the ring oscillator may be restricted to between three and five stages, which may be insufficient to provide a required 4-6 bit phase quantization resolution.

In some demonstrative embodiments, a ring oscillator may be implemented with interpolating delay cells, for example, to eliminate a limitation of a number of stages of the ring oscillator, e.g., as described below.

In some demonstrative embodiments, DPLL 120 may include a digitally controlled Ring Oscillator (DCRO) 122, which may be configured, for example, at least to achieve high frequency and/or low jitter performance, e.g., as described below.

In some demonstrative embodiments, DCRO 122 may be configured to generate a frequency output signal 134 according to a control signal 136, e.g., as described below.

In some demonstrative embodiments, DCRO 122 may include a plurality of stages connected in a cyclic order, e.g., as described below.

In some demonstrative embodiments, a stage of the plurality of stages may include two or more inverter modules controlled by control signal 136 and driven by an input, which is based on outputs from two or more first other stages of the plurality of stages, e.g., as described below.

In some demonstrative embodiments, outputs of the two or more inverter modules may drive inputs of two or more other stages of the plurality of stages, e.g., as described below.

In some demonstrative embodiments, the plurality of stages of DCRO 122 may include more than three stages, e.g., as described below.

In some demonstrative embodiments, the plurality of stages of DCRO 122 may include more than five stages, e.g., as described below. In other demonstrative embodiments, DCRO 122 may include more than ten stages, or any other number of stages.

In some demonstrative embodiments, DPLL 120 may include a decoder 128 configured to decode a phase of DCRO 122, for example, based on a plurality of sampled phases of the plurality of stages of DCRO 122, e.g., as described below. For example, the sampled phases of the stages of DCRO 122 may be sampled according to a reference frequency, e.g., as described below.

In some demonstrative embodiments, DPLL 120 may include a phase error estimator 126 configured to estimate a phase error, for example, based on the phase of DCRO 122 and a frequency control word, for example, of an input signal 132, e.g., as described below.

In some demonstrative embodiments, phase error estimator 126 may determine control signal 136 based on the phase error, e.g., as described below.

In some demonstrative embodiments, for example, in some use cases, implementations and/or scenarios, a DCRO implementation utilizing interpolating delay cells, e.g., as described below, may allow, for example, improving a phase quantization resolution of DPLL 120, and/or reducing a phase quantization noise of DPLL 120, e.g., as described below with reference to FIG. 2.

Figure 2:
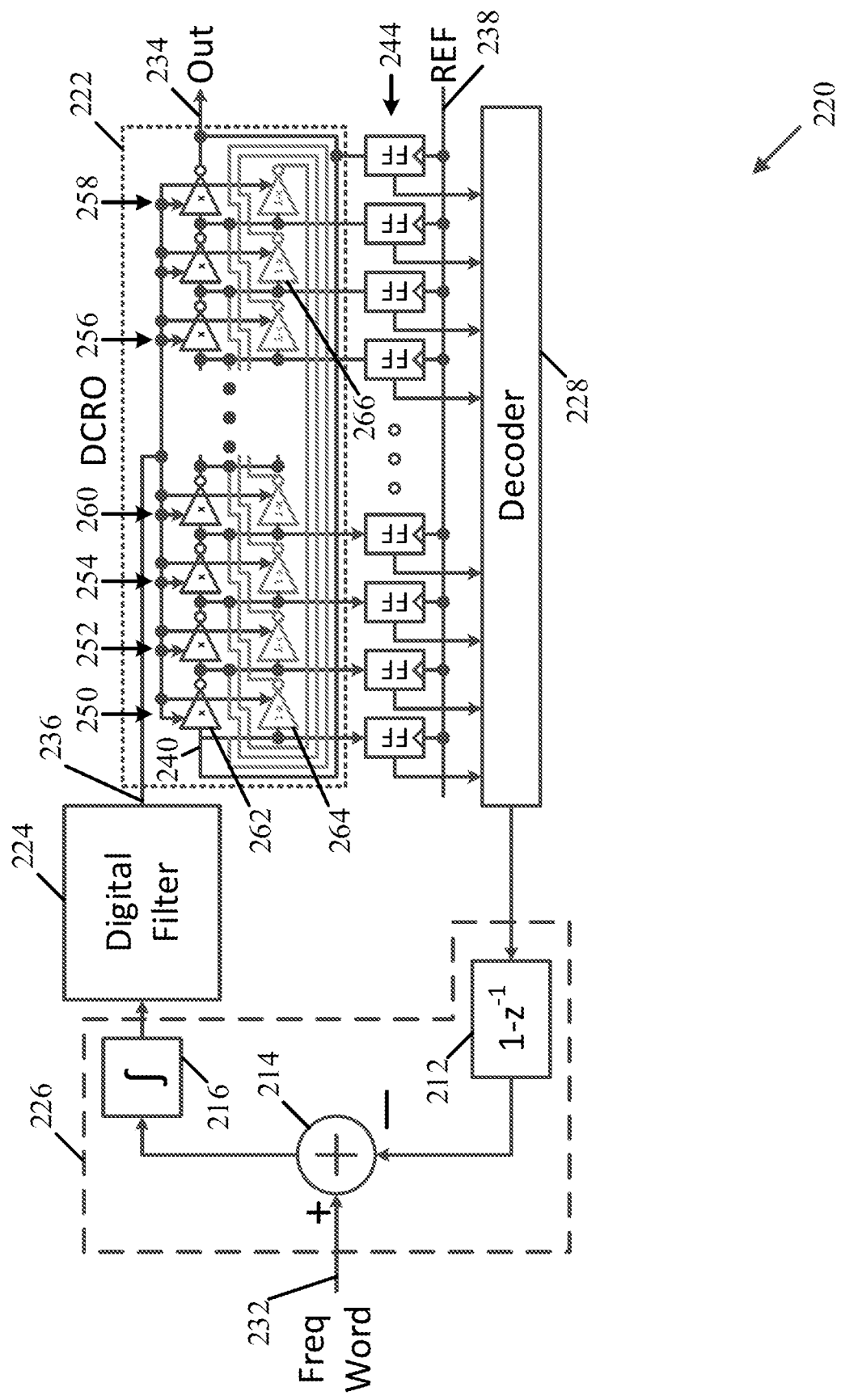
FIG. 2 is a schematic illustration of Digital Phase Locked Loop (DPLL) architecture, in accordance with some demonstrative embodiments.

Reference is made to FIG. 2, which schematically illustrates architecture of a DPLL 220, in accordance with some demonstrative embodiments. For example, DPLL 120 (FIG. 1) may include components of DPLL 220; DCRO 122 (FIG. 1) may include, perform the role of, perform one or more operations of, and/or perform one or more functionalities of a DCRO 222; decoder 128 (FIG. 1) may include, perform the role of, perform one or more operations of, and/or perform one or more functionalities of a decoder 228; and/or phase estimator 126 (FIG. 1) may include, perform the role of, perform one or more operations of, and/or perform one or more functionalities of a phase estimator 226.

In some demonstrative embodiments, DCRO 222 may be configured utilizing interpolating delay cells, e.g., as described below.

In some demonstrative embodiments, as shown in FIG. 2, DCRO 222 may include a plurality of stages, e.g., including stages 250, 252, 254, 256, 258, and/or 260.

In some demonstrative embodiments, a resolution of DCRO 222, e.g., a phase resolution provided by DCRO 222 may be based, for example, on a count of the stages of DCRO 222. For example, a greater number of stages of DCRO 122 may result in a finer resolution.

In some demonstrative embodiments, a stage of DCRO 222, e.g., stages 250, 252, 254, 256, 258, and/or 260, may be implemented as an interpolating delay cell, e.g., as described below.

In some demonstrative embodiments, utilizing interpolating delay cells may allow, for example, to shorten a delay per each stage of DCRO 222, e.g., as described below.

For example, a stage of DCRO 222 may be configured to drive a plurality of following stages of DCRO 222, e.g., to shorten the delay per stage of DCRO 222, for example, by providing head start to another stage.

In some demonstrative embodiments, for example, in some use cases, and/or scenarios, the interpolating delay cells may be utilized to implement DCRO 222 with a relatively large number of stages, for example, in order to cover a delay of the plurality of stages for a required oscillation frequency.

In some demonstrative embodiments, for example, in some use cases, and/or scenarios, a relatively large number of stages, for example, more than 3 stages, for example, more than 5 stages, e.g., even more than 10 stages, may allow to reduce a total flicker noise contribution of DCRO 222, for example, while contributing for a same power dissipation.

In some demonstrative embodiments, for example, in some use cases, and/or scenarios, a relatively large number of stages, for example, more than 3 stages, for example, more than 5 stages, e.g., even more than 10 stages, may be implemented by DCRO 222, for example, to improve a resolution of DPLL 220.

In some demonstrative embodiments, for example, in some use cases, and/or scenarios, a relatively large number of stages, for example, more than 3 stages, for example, more than 5 stages, e.g., even more than 10 stages, may be implemented, for example, to optimize synthesizing LO signals, which may be required, for example, for quadrature mixers or N-path mixers, e.g., in receiver 116 (FIG. 1).

In some demonstrative embodiments, as shown in FIG. 2, the plurality of stages of DCRO 222 may be connected in a cyclic order. For example, an output of a "last" stage 258, e.g., a stage providing an output frequency signal 234, may be connected back to an input of a "first" stage 250.

In some demonstrative embodiments, DCRO 222 may include an odd number of stages, for example, if DCRO 222 is implemented as a single end ring oscillator.

For example, DCRO 222 may include more than three stages, e.g., three, five, seven stages, and/or any other higher odd number of stages.

In some demonstrative embodiments, DCRO 222 may include either an odd number of stages, or an even number of stages, for example, if DCRO 222 is implemented as a differential ring oscillator.

For example, DCRO 222 may include three stages, four stages, five stages, or any other higher number of stages.

In some demonstrative embodiments, as shown in FIG. 2, a stage, e.g., each stage, of DCRO 222 may drive one or more following stages, e.g., as described below.

In some demonstrative embodiments, a stage, e.g., each stage, of DCRO 222 may be configured to drive inputs of two or more other stages of the plurality of stages of DCRO 222, e.g., as described below.

In some demonstrative embodiments, the two or more other stages may include a first subsequent stage, which is immediately subsequent to the stage according to the cyclic order, and at least one second subsequent stage, which is separated from the stage by a predefined number of stages according to the cyclic order.

In some demonstrative embodiments, the predefined number of stages may include any number of stages with a same signal polarity, e.g., such that all inputs of stages driven by a certain stage all have the same polarity.

In one example, the predefined number of stages may include an even number of stages.

In one example, stage 250 may drive an input to stage 252, which may be immediately subsequent to stage 250, and at least an input to stage 260, which may be separated from stage 250 by two stages, e.g., stages 252 and 254.

In another example, stage 258 may drive an input to stage 250, which may be immediately subsequent to stage 258 according to the cyclic order, and at least an input to stage 254, which may be separated from stage 258 by two stages, e.g., stages 250 and 252.

In some demonstrative embodiments, as shown in FIG. 2, a stage, e.g., each stage, of DCRO 222 may include two or more inverter modules.

In some demonstrative embodiments, the two or more inverter modules of a stage of DCRO 222 may include a first inverter module and at least one second inverter module.

For example, stage 250 may include a first inverter module, e.g., an inverter module 262, and a second inverter module, e.g., an inverter module 264.

In some demonstrative embodiments, one or more inverter modules of DCRO 222, e.g., inverter modules 262, 264 and/or 266, may include, may be implemented by, and/or may perform a functionality of, a single ended inverter, a differential inverter, and/or any other type of inverter.

In some demonstrative embodiments, one or more inverter modules of DCRO 222, e.g., inverter modules 262, 264 and/or 266, may include, may be implemented by, and/or may perform a functionality of, a static Complementary metal-oxide-semiconductor (CMOS) inverter, a current mode inverter cell, and/or any other type of inverter.

In some demonstrative embodiments, the two or more inverter modules of a stage of DCRO 222 may be controlled by a same control signal, and driven by a same input.

For example, inverter modules 262 and 264 may be controlled by a control signal 236, and driven by an input 240.

In some demonstrative embodiments, the input of a stage, e.g., each stage, of DCRO 222 may be based on outputs from two or more first other stages of the plurality of stages.

For example, input 240 may be based on outputs from stage 256 and stage 258.

In some demonstrative embodiments, outputs of the two or more inverter modules of a stage, e.g., each stage, of DCRO 222 may be configured to drive inputs of the two or more other stages of the plurality of stages, e.g., as described below.

In some demonstrative embodiments, an output of the first inverter module of a stage may be configured to drive an input of a first subsequent stage.

In some demonstrative embodiments, the first inverter module may be configured as a main inverter module, for example, if the first inverter module drives the input of the first subsequent stage.

For example, an output of inverter module 262 may be configured to drive an input of stage 252. According to this example, inverter module 262 may perform the role of the main inverter module.

In some demonstrative embodiments, an output of the at least one second inverter module may be configured to drive a respective input of at least one second subsequent stage.

In some demonstrative embodiments, the at least one second inverter module may be configured as an interpolating inverter module.

For example, an output of inverter module 264 may be configured to drive an input of stage 260. According to this example, inverter module 262 may perform the role of the interpolating inverter module.

In some demonstrative embodiments, DPLL 220 may be configured to tune a frequency of DCRO 222, for example, through interpolation weights, which may be controllably applied to the stages of DCRO 222, e.g., as described below.

In some demonstrative embodiments, utilizing the interpolation weights may allow, for example, achieving reduced parasitics and/or a wide tuning range.

In some demonstrative embodiments, utilizing the interpolation weights may allow, for example, operating DCRO 222 at an increased frequency and/or a reduced flicker noise.

In some demonstrative embodiments, DCRO 222 may be configured to utilize the interpolation weights, for example, by applying different weights to the two or more inverter modules of a stage, e.g., as described below.

For example, as shown in FIG. 2, DCRO 222 may be configured to apply to inverter module 262 a first weight denoted x, and to apply to inverter module 264 a second weight, denoted 1-x.

In some demonstrative embodiments, DCRO 222 may be configured to apply different weights to two or more inverter modules of different stages, e.g., as described below with reference to FIG. 3.

In some demonstrative embodiments, the two or more inverter modules of the different stages may all drive the input of a same stage, e.g., as described below.

For example, as shown in FIG. 2, inverter module 262 and inverter module 266 may drive the input of stage 252. According to this example, DCRO 222 may be configured to apply to inverter module 262 the weight x, and to apply to inverter module 266 the weight 1-x.

In some demonstrative embodiments, an inverter module of the two or more inverter modules of the stage may include a plurality of inverters connected in parallel, e.g., as described below with reference to FIG. 3.

In some demonstrative embodiments, a weight of the inverter module relative to another inverter module of the two or more inverter modules may be controlled, for example, by controlling a count of activated inverters in the plurality of inverters of the inverter module, e.g., as described below with reference to FIG. 3.

In some demonstrative embodiments, a frequency output of DPLL 220, e.g., an output signal 234, may be controlled, for example, based on weight of one inverter module relative to another inverter module.

In one example, an oscillation frequency of output signal 234 may be controlled, for example, by controlling the weight of inverter module 262 relative to inverter module 264.

In another example, the oscillation frequency of output signal 234 may be controlled, for example, based on the weight of inverter module 262 relative to inverter module 266.

In some demonstrative embodiments, DPLL 220 may include a latch bank 244 configured to sample phases of the plurality of stages of DCRO 222, e.g., according to a frequency of a reference signal 238.

In some demonstrative embodiments, latch bank 244 may include a plurality of flip-flops. For example, a flip-flop may be configured to sample a phase of a respective stage of DCRO 222, e.g., according to the frequency of reference signal 238.

In one example, latch bank 244 may sample the phase of the stages of DCRO 222, for example, when reference signal 238 is at a rising edge. According to this example, latch bank 244 may sample the phase of each stage of DCRO 222, for example, when reference signal 238 changes from a logical low level to a logical high level.

In another example, latch bank 244 may sample the phase of each stage of DCRO 222, for example, when reference signal 238 is at a falling edge. According to this example, latch bank 244 may sample the phase of each stage of DCRO 222, for example, when reference signal 238 changes from the logical high level to the logical low level.

In another example, latch bank 244 may sample the phase of stages of DCRO 222, for example, when an edge of reference signal 238 changes. According to this example, latch bank 244 may sample the phase of each stage of DCRO 222, for example, when reference signal 238 changes either from the logical low level to the logical high level, or from the logical high level to the logical low level.

In some demonstrative embodiments, DPLL 220 may include a decoder 228 configured to decode a phase of DCRO 222, e.g., as described below.

In some demonstrative embodiments, decoder 228 may be configured to decode the phase of DCRO 222, e.g., based on the plurality of sampled phases of the plurality of stages, e.g., as sampled by latch bank 244.

In some demonstrative embodiments, decoder 228 may be configured to decode the phase of DCRO 222, for example, based on a count of the plurality of stages of DCRO 222, e.g., as described below.

In some demonstrative embodiments, decoder 228 may decode the phase of DCRO 222, for example, based on a period of DCRO 222, e.g., as described below.

In some demonstrative embodiments, decoder 228 may determine the period of DCRO 222, for example, based on the count of the plurality of stages of DCRO 222, e.g., as described below.

In one example, the period of DCRO 222 may be determined as the count of the plurality of stages of DCRO 222 multiplied by two.

In some demonstrative embodiments, DPLL 220 may include a phase error estimator 226 configured to estimate a phase error of DCRO 222, for example, based on the phase of DCRO 222 and a frequency control word 232, e.g., as described below.

In some demonstrative embodiments, phase error estimator 226 may include a frequency estimator 212 configured to generate a phase frequency corresponding to a change in the phase of DCRO 222, for example, by applying a delay operator to the phase of DCRO 222, e.g., as described below.

In some demonstrative embodiments, phase error estimator 226 may include a subtractor 214 configured to provide a frequency error of DCRO 222, for example, by subtracting the phase frequency from frequency control word 232.

In some demonstrative embodiments, phase error estimator 226 may include an accumulator 216 configured to generate the phase error of DCRO 222, for example, based on the frequency error.

In some demonstrative embodiments, DPLL 220 may include a digital filter 224 configured to maintain a stability of DPLL 220 for example, by providing control signal 236, e.g., based on the phase error from phase error estimator 226.

Figure 3:
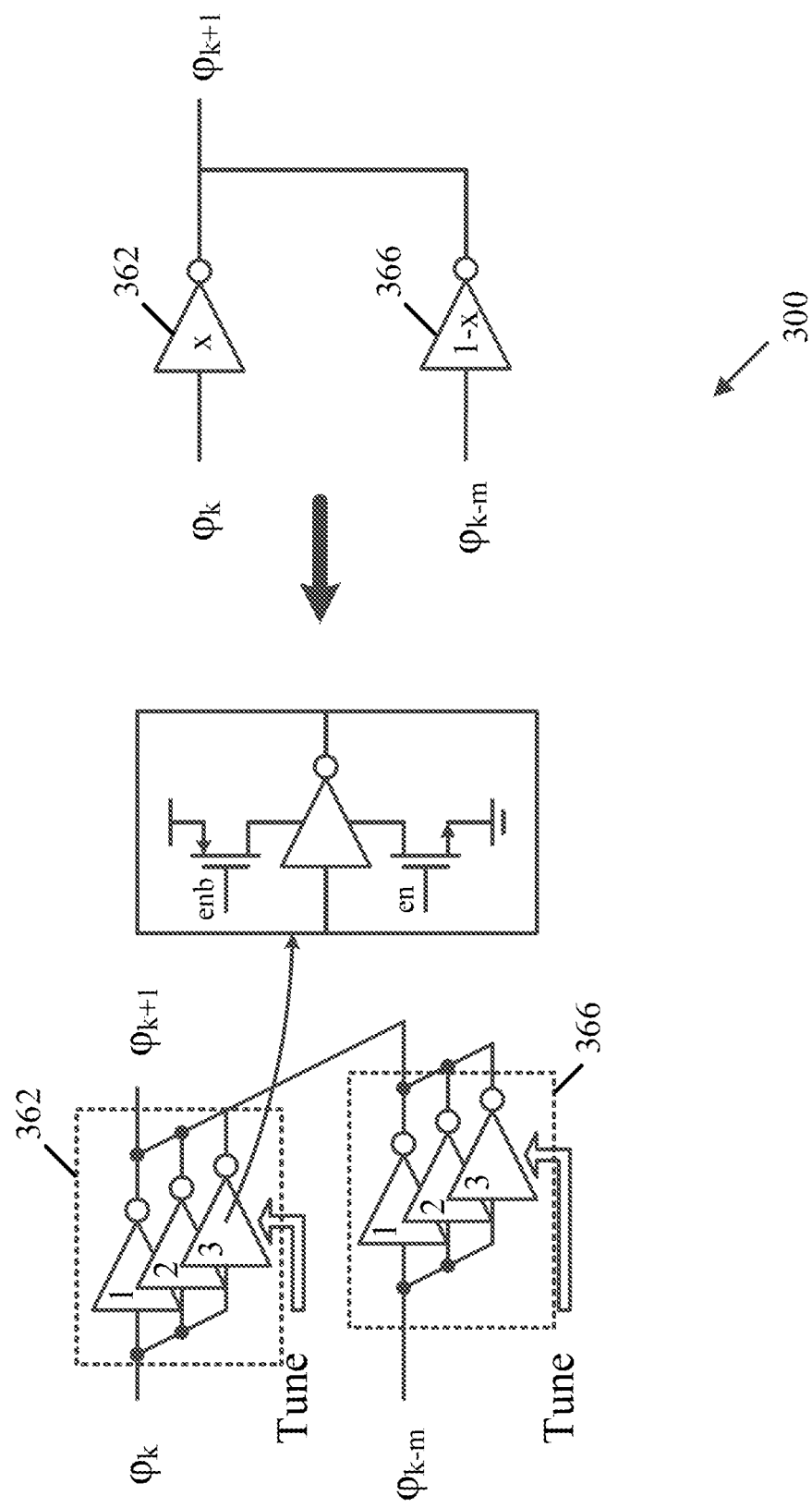
FIG. 3 is a schematic illustration of an interpolation tuning mechanism of a digitally controlled ring oscillator (DCRO), in accordance with some demonstrative embodiments.

Reference is now made to FIG. 3, which schematically illustrates an interpolation tuning mechanism 300, in accordance with some demonstrative embodiments.

In some demonstrative embodiments, DCRO 222 (FIG. 2) may be configured to implement interpolation tuning mechanism 300, e.g., as described below.

In some demonstrative embodiments, interpolation tuning mechanism 300 may allow, for example, an implementation with compact delay cells.

In some demonstrative embodiments, interpolation tuning mechanism 300 may allow, for example, operating DCRO 222 (FIG. 2) at a relatively high frequency of oscillation.

In some demonstrative embodiments, interpolation tuning mechanism 300 may allow, for example, operating DCRO 222 (FIG. 2) at a relatively low power.

In some demonstrative embodiments, DCRO 222 (FIG. 2) may implement interpolation tuning mechanism 300, for example, to adjust a frequency of DCRO 222 (FIG. 2) through interpolation weights, e.g., as described below.

In some demonstrative embodiments, the interpolation weights may be implemented by applying relative drive strengths to different interpolating paths, e.g., as described below.

In some demonstrative embodiments, an inverter module 362 may include, perform the role of, perform one or more operations of, and/or perform one or more functionalities of inverter module 262 (FIG. 2), and/or an inverter module 366 may include, perform the role of, perform one or more operations of, and/or perform one or more functionalities of an inverter module 266 (FIG. 2).

In some demonstrative embodiments, inverter module 362 and inverter module 366 may be configured to drive a same stage of DCRO 222 (FIG. 2), e.g., stage 252 (FIG. 2).

In some demonstrative embodiments, the relative weights of inverter modules 362 and 366 may controlled, for example, by applying different drive strengths to inverter modules 366 and 362.

In some demonstrative embodiments, a weight of inverter module 362 may be greater than a weight of inverter module 366, for example, if inverter module 362 performs the role of the main inverter module, and inverter module 366 performs the role of the interpolating inverter module. In other embodiments, the relative weights of inverter modules 362 and 366 may be determined base don any other additional or alternative criteria.

In some demonstrative embodiments, the weight of inverter module 362 may be configured to be complimentary to the weight of inverter module 366.

For example, as shown in FIG. 3, the inverter module 362 may have the weight x, and the inverter module 366 may have the weight 1-x.

In some demonstrative embodiments, an inverter module of the two or more inverter modules of a DCRO stage, e.g., inverter module 362, may include a plurality of inverters connected in parallel.

In one example, as shown in FIG. 3, inverter module 362 may include three inverters connected in parallel, e.g., inverters $362_1$, $362_2$, and/or $362_3$. In another example, inverter module 362 may include any other number of inverters.

In some demonstrative embodiments, the weight of inverter module 362 relative to inverter module 366 may be controlled, for example, based on a count of activated inverters in each of the inverter modules 362 and 366.

In one example, inverter $362_1$ of inverter module 362 may be activated, and inverters $362_2$, and/or $362_3$ may be deactivated. According to this example, inverter module 362 may have a weight of ⅓.

In another example, inverters $366_1$ and $366_2$ of inverter module 366 may be activated, and inverter $366_3$ may be de activated. According to this example, inverter module 366 may have a weight of ⅔.

In some demonstrative embodiments, a tuning step may be set by a smallest incremental transistor finger in a process, e.g., a larger number of inverters per inverter module may be utilized to provide an increased level of tuning.

In some demonstrative embodiments, the interpolation cells of a DCRO may be grouped into four quadrature banks with one cell in each phase bank incremented simultaneously, for example, in order to preserve symmetry between I-Q phases.

Figure 4:
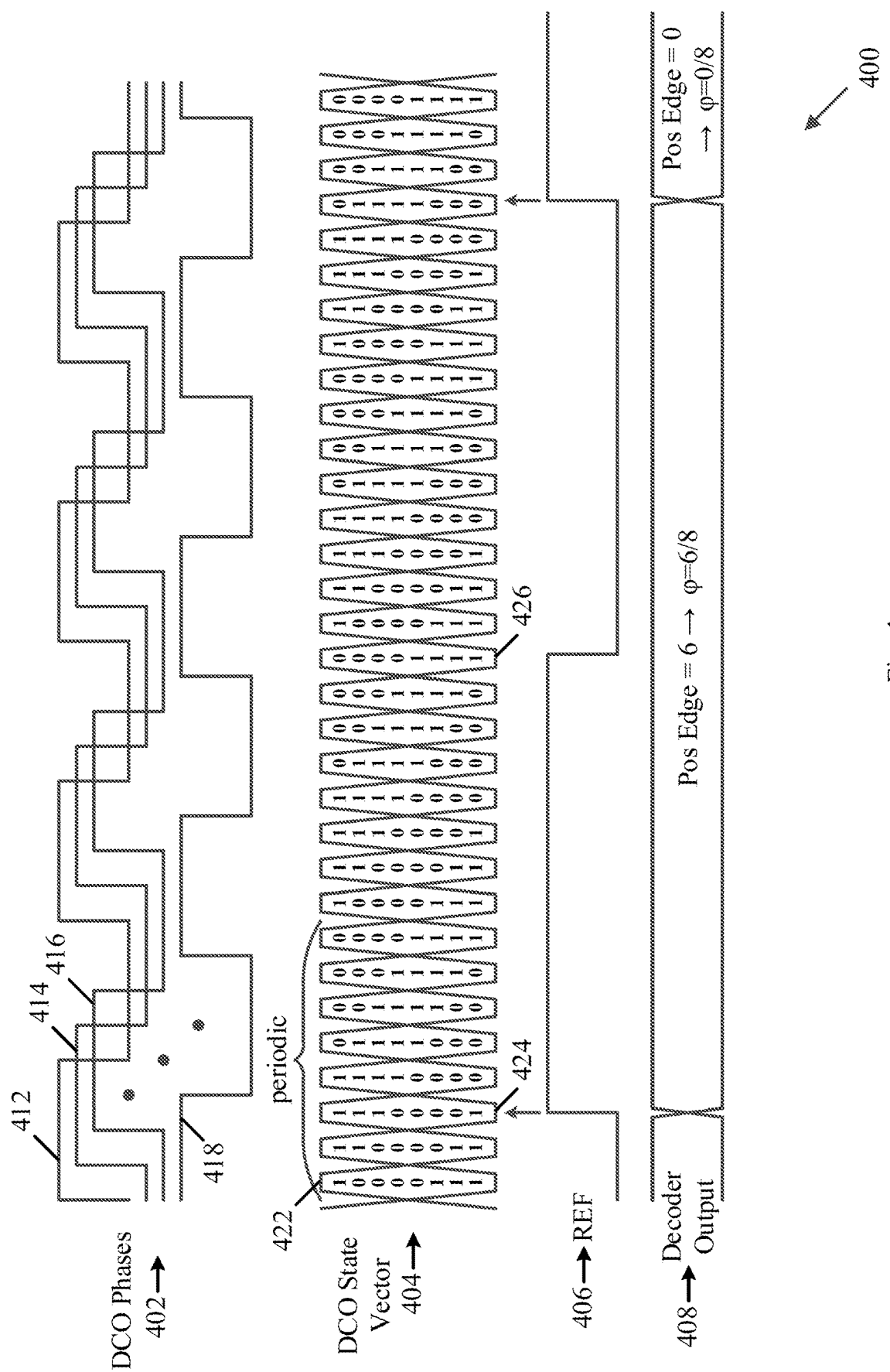
FIG. 4 is a schematic illustration of a timing diagram corresponding to DCRO phases, a DCRO state vector, a reference signal, and a decoder output, in accordance with some demonstrative embodiments.

Reference is now made to FIG. 4, which schematically illustrates a timing diagram 400, in accordance with some demonstrative embodiments.

In some demonstrative embodiments, for example, in some use cases, and/or scenarios, it may be advantageous to eliminate need of additional period calibration and normalization circuitry for tracking a frequency of a DCRO, e.g., as described below.

In some demonstrative embodiments, DPLL 220 (FIG. 2) may be configured to automatically track a frequency of DCRO 222 (FIG. 2), e.g., by using multiple phases of DCRO 222 (FIG. 2) for decoding a phase of DCRO (FIG. 2).

In some demonstrative embodiments, timing diagram 400 may represent an example of timing diagram of DPLL 220 (FIG. 2), e.g., as described below.

For example, timing diagram 400 may correspond to a DPLL with eight phases.

In some demonstrative embodiments, latch bank 244 (FIG. 2) may sample phases of each stage of DCRO 222 (FIG. 2), e.g., DCRO phases 402.

For example, a DCRO phase 412 may represent a phase of stage 250 (FIG. 2); a DCRO phase 414 may represent a phase of stage 252 (FIG. 2); a DCRO phase 416 may represent a phase of stage 254 (FIG. 2); and/or a DCRO phase 418 may represent a phase of stage 258 (FIG. 2).

In some demonstrative embodiments, as shown in FIG. 4, a DCRO state vector 404 may represent a state of each stage of DCRO 222 (FIG. 2) at a certain moment.

For example, a DCRO state vector 422 may show a value of a logic level of DCRO phases 402 at a certain first moment. According to this example, DCRO state vector 422 may show that at the first moment DCRO phase 412 may be at the logical high level; DCRO phase 414 may be at the logical low level; DCRO phase 416 may be at the logical low level; and/or DCRO phase 418 may be at the logical high level.

In some demonstrative embodiments, as shown in FIG. 4, a reference signal 406 may values of represent reference signal 238 (FIG. 2).

In some demonstrative embodiments, latch bank 244 (FIG. 2) may sample DCRO phases 402, e.g., according to a frequency of reference signal 406.

In one example, latch bank 244 (FIG. 2) may sample DCRO phases 402, for example, only at the rising edge of reference signal 406, e.g., only when reference signal 406 changes from the logical low level to the logical high level.

In another example, latch bank 244 (FIG. 2) may sample DCRO phases 402, for example, when the edge of reference signal 406 changes, e.g., when reference signal 406 changes from a first logical level to a second logical level, different from the first logical level.

In some demonstrative embodiments, as shown in FIG. 4, a decoder output signal 408 may represent an output of decoder 228 (FIG. 2).

In some demonstrative embodiments, decoder 228 (FIG. 2) may decode the phase of DCRO 222 (FIG. 2), e.g., based on the plurality of sampled phases, e.g., as described below.

In some demonstrative embodiments, decoder 228 (FIG. 2) may decode the phase of DCRO 222 (FIG. 2), e.g., based on a minimum cycle difference between a current DCRO state vector and a previous ("initial") DCRO state vector, e.g., as described below.

For example, as shown in FIG. 4, the current DCRO state vector may include a DCRO state vector 426, and the initial DCRO state vector may include DCRO state vector 424.

In some demonstrative embodiments, decoder 228 (FIG. 2) may decode the phase of DCRO 222 (FIG. 2), e.g., based on a count of the plurality of stages of DCRO 222 (FIG. 2). For example, decoder 228 (FIG. 2) may determine the period of the DCRO 222 (FIG. 2), e.g., based on the count of the plurality of stages of DCRO 222 (FIG. 2), e.g., as described above.

In some demonstrative embodiments, decoder 228 (FIG. 2) may decode the phase of DCRO 222 (FIG. 2), e.g., by dividing the cycle difference between the current DCRO state vector and the initial DCRO state vector by the period of DCRO 222 (FIG. 2).

For example, as shown in FIG. 4, the minimum cycle difference between DCRO state vector 426 and DCRO state vector 424 may be six, and the period of DCRO 222 (FIG. 2) may be eight. According to this example, decoder 228 (FIG. 2) may determine the phase of DCRO 222 (FIG. 2) as being 6/8.

Figure 5:
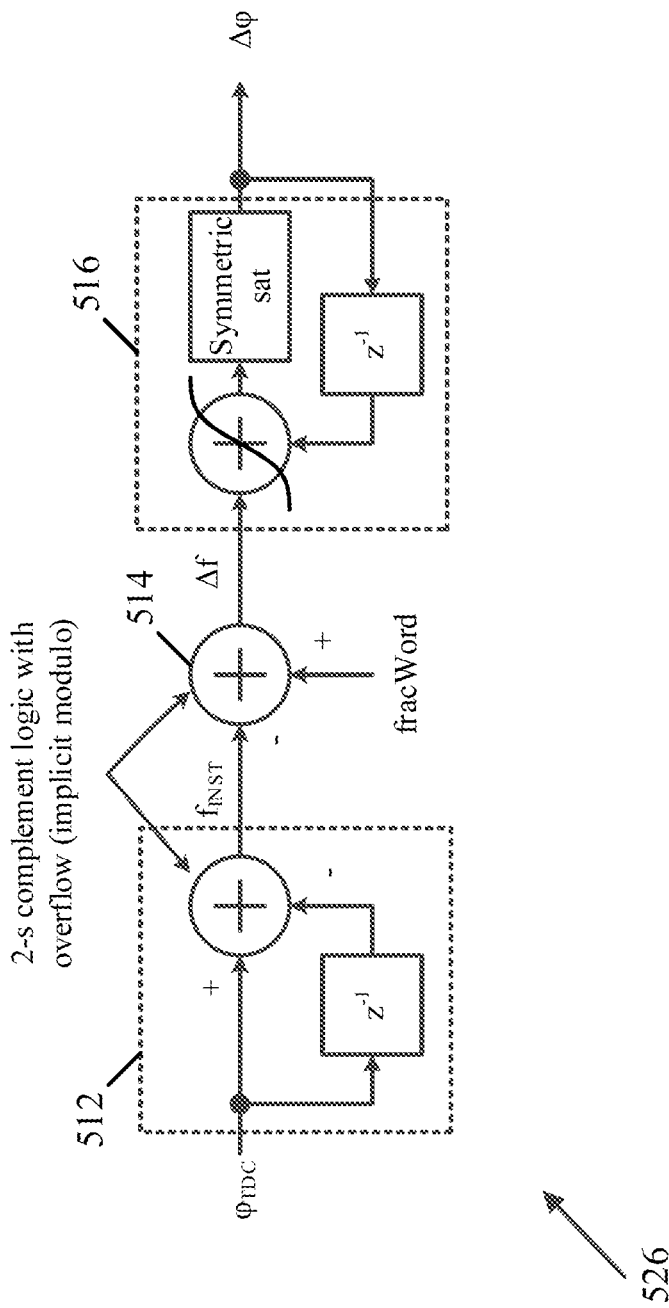
FIG. 5 is a schematic illustration of a phase error estimator, in accordance with some demonstrative embodiments.

Reference is now made to FIG. 5, which schematically illustrates a phase error estimator 526, in accordance with some demonstrative embodiments. For example, phase estimator 226 (FIG. 2) may include, perform the role of, perform one or more operations of, and/or perform one or more functionalities of phase estimator 526; frequency estimator 212 (FIG. 2) may include, perform the role of, perform one or more operations of, and/or perform one or more functionalities of a frequency estimator 512; subtractor 214 (FIG. 2) may include, perform the role of, perform one or more operations of, and/or perform one or more functionalities of a subtractor 514; and/or accumulator 216 (FIG. 2) may include, perform the role of, perform one or more operations of, and/or perform one or more functionalities of an accumulator 516.

In some demonstrative embodiments, DPLL 220 (FIG. 2) may track the frequency of DCRO 222 (FIG. 2), for example, even without additional period calibration and/or normalization circuitry, e.g., as described above.

In some demonstrative embodiments, as a result of a tracking behavior of DPLL 220 (FIG. 2), the implementation of loop logic of DPLL 220 (FIG. 2) may be greatly simplified, which may allow, for example, operating DPLL 220 (FIG. 2) at a relatively reduced power level.

For example, as shown in FIG. 5, DPLL 220 (FIG. 2) may be implemented using simple 2s-complement arithmetic, for example, even with just an implicit wrap around in adders to implement required phase modulo-arithmetic.

Figure 6:
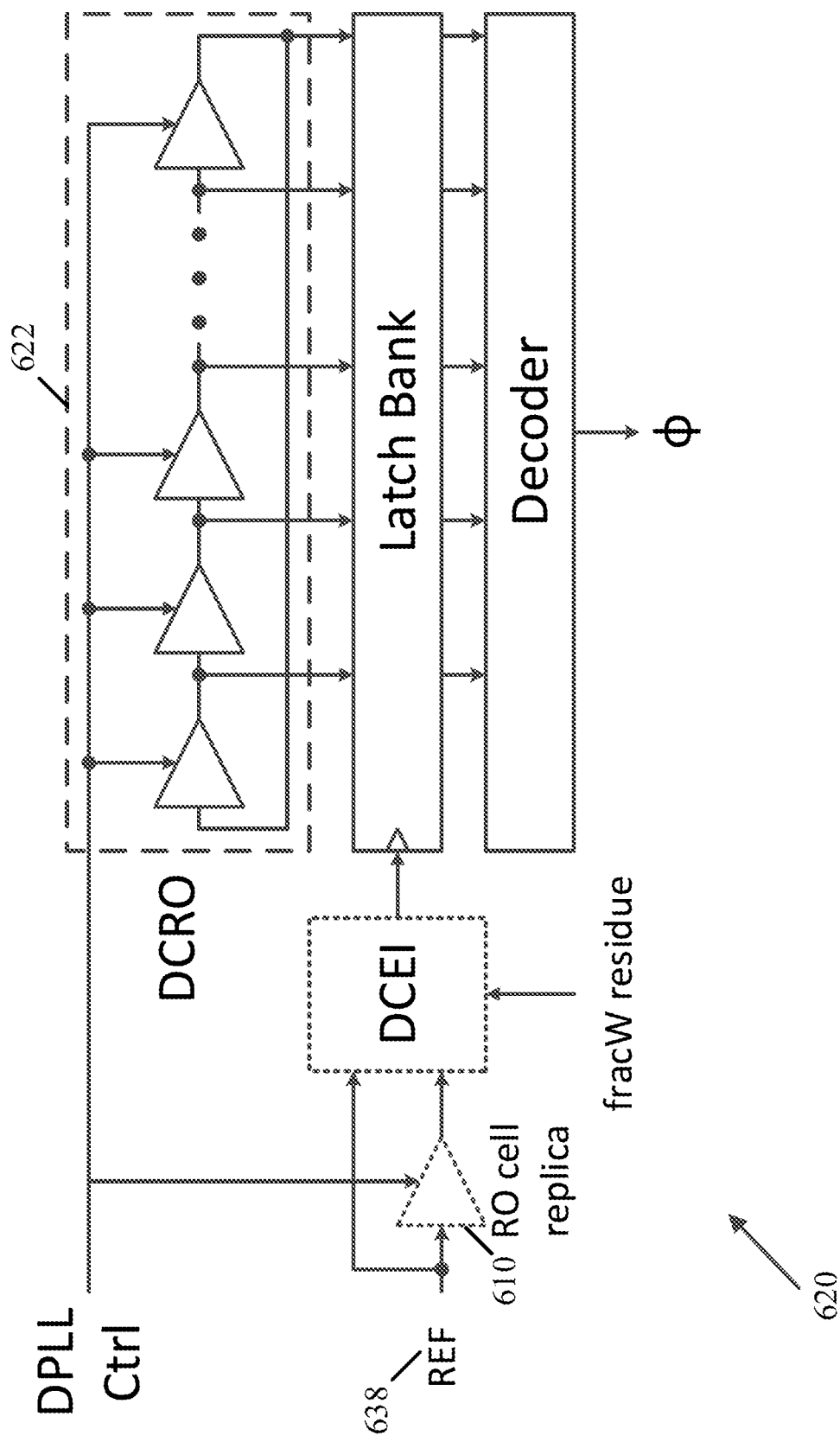
FIG. 6 is a schematic illustration of a DPLL with self-aligned reference dithering, in accordance with some demonstrative embodiments.

Reference is now made to FIG. 6, which schematically illustrates a DPLL 620, in accordance with some demonstrative embodiments. For example, DPLL 220 (FIG. 2) may include, perform the role of, perform one or more operations of, and/or perform one or more functionalities of DPLL 620; and/or DCRO 222 (FIG. 2) may include, perform the role of, perform one or more operations of, and/or perform one or more functionalities of a DCRO 622.

In some demonstrative embodiments, DPLL 620 may include a fractional-N digital PLL configured to generate a frequency output as a non-integer multiple of a frequency of a reference signal, for example, a reference signal 638, e.g., as described below.

In some demonstrative embodiments, DPLL 620 may be configured to further reduce a phase quantization noise, for example, in a locked state, e.g., as described below.

In some demonstrative embodiments, DPLL 620 may be configured to reduce the phase quantization noise, e.g., by dithering a reference signal, e.g., as described below.

In some demonstrative embodiments, adding an additional phase sampling of DCRO 622 may improve a resolution of DPLL 620, e.g., as described below.

In some demonstrative embodiments, a residue from an accumulated frequency control word may be used to shift an edge of reference signal 638, e.g., in order to add additional phase sampling of DCRO 622.

In some demonstrative embodiments, a ring oscillator (RO) cell replica 610 may be used to achieve a relatively finer resolution of DPLL 620, e.g., as described below.

In some demonstrative embodiments, as shown in FIG. 6, reference signal 638 may be delayed by RO cell replica 610.

In some demonstrative embodiments, as shown in FIG. 6, reference signal 638 and delayed reference signal 638 may be fed to an input of a digitally controlled edge interpolator (DCEI) 630.

In some demonstrative embodiments, DCEI 630 may include an array of Multiplex (MUX) cells.

In some demonstrative embodiments, DPLL 620 may be configured to achieve a relatively finer Least Significant Bit (LSB), e.g., by controlling the number of MUX cells connected to either reference signal 638 or delayed reference signal 638.

Figure 7:
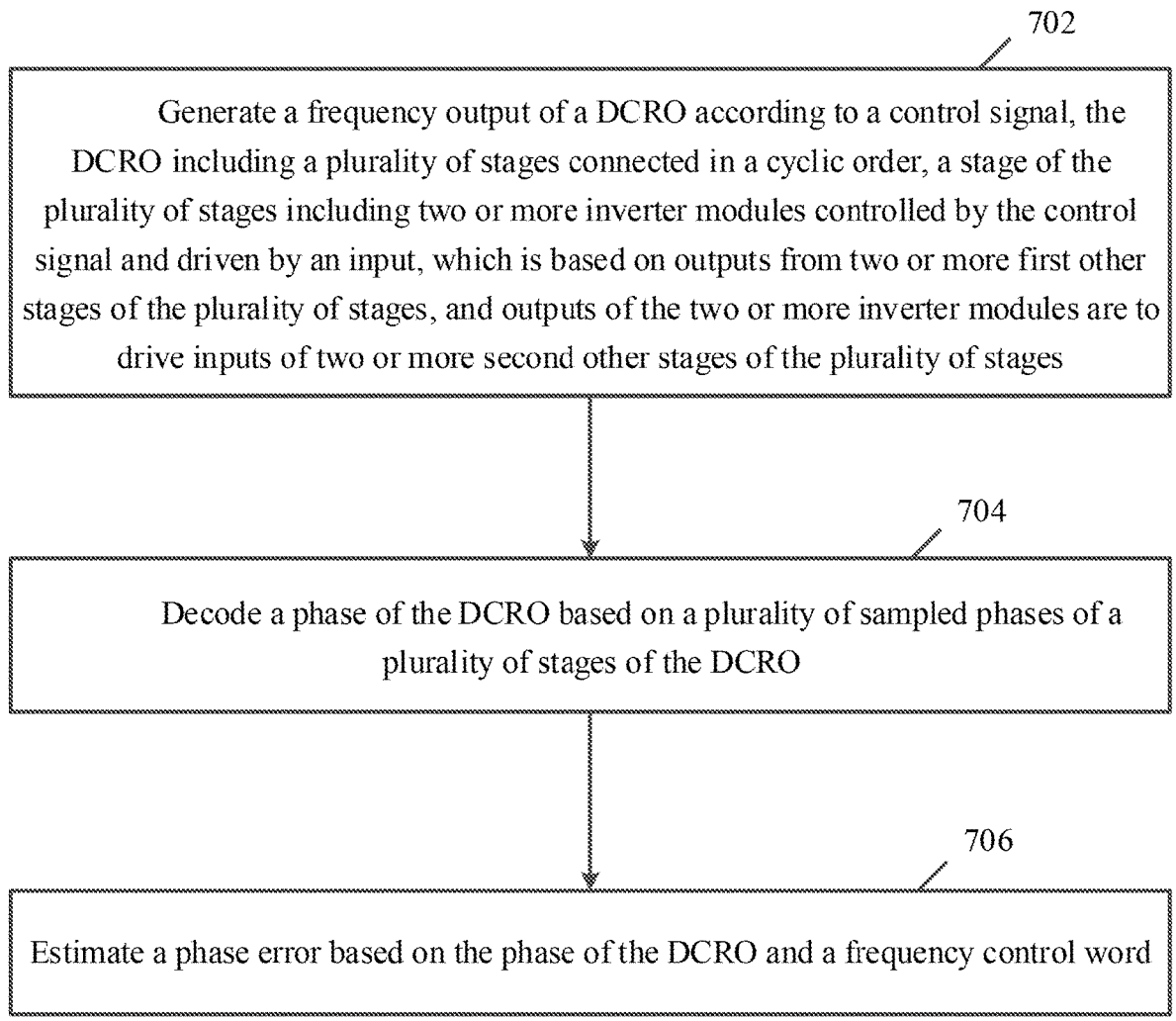
FIG. 7 is a schematic flow-chart illustration of a method of generating a frequency output with a DCRO, in accordance with some demonstrative embodiments.

Reference is made to FIG. 7, which schematically illustrates a method of generating a frequency output with a DCRO, in accordance with some demonstrative embodiments. For example, one or more of the operations of the method of FIG. 7 may be performed by one or more elements of a system, e.g., system 100 (FIG. 1), for example, one or more wireless devices, e.g., device 102 (FIG. 1); a DPLL, e.g., DPLL 120 (FIG. 1); a DCRO, e.g., DCRO 122 (FIG. 1); a decoder, e.g., decoder 128 (FIG. 1); and/or a phase error estimator, e.g., phase error estimator 126 (FIG. 1).

As indicated at block 702, the method may include generating a frequency output of a DCRO according to a control signal. For example, the DCRO may include a plurality of stages connected in a cyclic order, a stage of the plurality of stages including two or more inverter modules controlled by the control signal and driven by an input, which is based on outputs from two or more first other stages of the plurality of stages, and outputs of the two or more inverter modules are to drive inputs of two or more second other stages of the plurality of stages. For example, DCRO 122 (FIG. 1) may generate frequency output 134 (FIG. 1) according to control signal 136 (FIG. 1), e.g., as described above.

As indicated at block 704, the method may include decoding a phase of the DCRO based on a plurality of sampled phases of a plurality of stages of the DCRO. For example, decoder 128 (FIG. 1) may decode the phase of DCRO 122 (FIG. 1) based on the plurality of sampled phases of the plurality of stages of DCRO 122 (FIG. 1), e.g., as described above.

As indicated at block 706, the method may include estimating a phase error based on the phase of the DCRO and a frequency control word. For example, phase error estimator 126 (FIG. 1) may estimate the phase error based on the phase of the DCRO 122 (FIG. 1) and frequency control word 132 (FIG. 1), e.g., as described above.

As indicated at block 708, the method may include generating the control signal based on the phase error. For example, phase error estimator 126 (FIG. 1) may generate control signal 136 (FIG. 1) based on the phase error, e.g., as described above.

Figure 8:
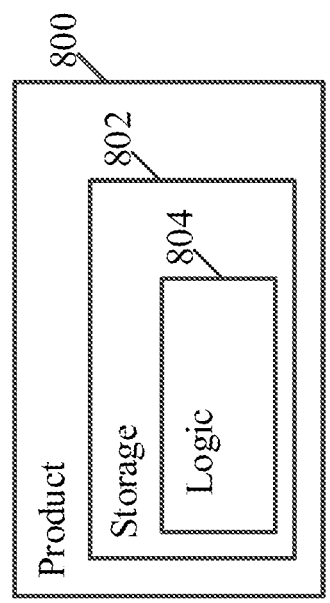
FIG. 8 is a schematic illustration of a product of manufacture, in accordance with some demonstrative embodiments.

Reference is made to FIG. 8, which schematically illustrates a product of manufacture 800, in accordance with some demonstrative embodiments. Product 800 may include one or more tangible computer-readable non-transitory storage media 802, which may include computer-executable instructions, e.g., implemented by logic 804, operable to, when executed by at least one computer processor, enable the at least one computer processor to implement one or more operations at device 102 (FIG. 1), transmitter 118 (FIG. 1), receiver 116 (FIG. 1), controller 124 (FIG. 1), DPLL 120 (FIG. 1), and/or DPLL 220 (FIG. 2), and/or to perform one or more operations described above with respect to FIGS. 1, 2, 3, 4, 5, 6, and/or 7, and/or one or more operations described herein. The phrase "non-transitory machine-readable medium" is directed to include all computer-readable media, with the sole exception being a transitory propagating signal.

In some demonstrative embodiments, product 800 and/or storage media 802 may include one or more types of computer-readable storage media capable of storing data, including volatile memory, non-volatile memory, removable or non-removable memory, erasable or non-erasable memory, writeable or re-writeable memory, and the like. For example, storage media 802 may include, RAM, DRAM, Double-Data-Rate DRAM (DDR-DRAM), SDRAM, static RAM (SRAM), ROM, programmable ROM (PROM), erasable programmable ROM (EPROM), electrically erasable programmable ROM (EEPROM), Compact Disk ROM (CD-ROM), Compact Disk Recordable (CD-R), Compact Disk Rewriteable (CD-RW), flash memory (e.g., NOR or NAND flash memory), content addressable memory (CAM), polymer memory, phase-change memory, ferroelectric memory, silicon-oxide-nitride-oxide-silicon (SONOS) memory, a disk, a floppy disk, a hard drive, an optical disk, a magnetic disk, a card, a magnetic card, an optical card, a tape, a cassette, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some demonstrative embodiments, logic 804 may include instructions, data, and/or code, which, if executed by a machine, may cause the machine to perform a method, process and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some demonstrative embodiments, logic 804 may include, or may be implemented as, software, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner or syntax, for instructing a processor to perform a certain function. The instructions may be implemented using any suitable high-level, low-level, object-oriented, visual, compiled and/or interpreted programming language, such as C, C++, Java, BASIC, Matlab, Pascal, Visual BASIC, assembly language, machine code, and the like.

EXAMPLES

The following examples pertain to further embodiments.

Example 1 includes a digital Phase Locked Loop (PLL) comprising a digitally controlled Ring Oscillator (DCRO) configured to generate a frequency output based on a control signal, the DCRO comprising a plurality of stages in a cyclic order, a first stage of the plurality of stages comprising a plurality of inverter modules controlled by the control signal and comprising a plurality of outputs that drive inputs of a plurality of second stages in the plurality of stages; a decoder to decode a phase of the DCRO based on a plurality of sampled phases of the plurality of stages of the DCRO; and a phase error estimator to estimate a phase error based on the phase of the DCRO and a frequency control word, the control signal is based on the phase error.

Example 2 includes the subject matter of Example 1, and optionally, wherein the plurality of inverter modules of the first stage are driven by an input to the first stage, the input to the first stage is based on outputs of two or more stages of the plurality of stages of the DCRO.

Example 3 includes the subject matter of Example 2, and optionally, wherein the input to the first stage comprises a weighted combination of the outputs of the two or more stages of the plurality of stages.

Example 4 includes the subject matter of any one of Examples 1-3, and optionally, wherein the plurality of second stages comprises a first subsequent stage immediately subsequent to the first stage according to the cyclic order, and a second subsequent stage separated from the first stage by a predefined number of stages based on the cyclic order.

Example 5 includes the subject matter of Example 4, and optionally, wherein the predefined number of stages comprises an even number of stages.

Example 6 includes the subject matter of Example 4 or 5, and optionally, wherein the plurality of inverter modules of the first stage comprises a first inverter module having an output to drive an input of the first subsequent stage; and a second inverter module having an output to drive an input of the second subsequent stage.

Example 7 includes the subject matter of any one of Examples 1-6, and optionally, wherein a first inverter module of the plurality of inverter modules of the first stage comprises a plurality of inverters connected in parallel, wherein a weight of the first inverter module relative to a second inverter module of the plurality of inverter modules of the first stage is based on a count of activated inverters in the plurality of inverters.

Example 8 includes the subject matter of Example 7, and optionally, wherein the frequency output is based on the weight of the inverter module.

Example 9 includes the subject matter of any one of Examples 1-8, and optionally, wherein the decoder is configured to decode the phase of the DCRO based on a count of the plurality of stages of the DCRO.

Example 10 includes the subject matter of any one of Examples 1-9, and optionally, wherein a period of the DCRO is based on a count of the plurality of stages of the DCRO.

Example 11 includes the subject matter of any one of Examples 1-10, and optionally, wherein the phase error estimator comprises a frequency estimator to generate a phase frequency corresponding to a change in the phase of the DCRO by applying a delay operator to the phase of the DCRO; a subtractor to generate a frequency error by subtracting the phase frequency from the frequency control word; and an accumulator to generate the phase error based on the frequency error.

Example 12 includes the subject matter of any one of Examples 1-11, and optionally, wherein the plurality of stages of the DCRO comprises an odd number of stages.

Example 13 includes the subject matter of any one of Examples 1-12, and optionally, wherein the plurality of stages of the DCRO comprises more than three stages.

Example 14 includes the subject matter of any one of Examples 1-13, and optionally, wherein the plurality of stages of the DCRO comprises more than five stages.

Example 15 includes the subject matter of any one of Examples 1-14, and optionally, wherein the plurality of stages of the DCRO comprises more than ten stages.

Example 16 includes the subject matter of any one of Examples 1-15, and optionally, comprising a fractional-N digital PLL to generate the frequency output as a non-integer multiple of a reference frequency, the sampled phases to be sampled according to the reference frequency.

Example 17 includes a wireless communication device comprising one or more antennas; a digital Phase Locked Loop (PLL) comprising a digitally controlled Ring Oscillator (DCRO) configured to generate a frequency output based on a control signal, the DCRO comprising a plurality of stages in a cyclic order, a first stage of the plurality of stages comprising a plurality of inverter modules controlled by the control signal and comprising a plurality of outputs that drive inputs of a plurality of second stages in the plurality of stages; a decoder to decode a phase of the DCRO based on a plurality of sampled phases of the plurality of stages of the DCRO; and a phase error estimator to estimate a phase error based on the phase of the DCRO and a frequency control word, the control signal is based on the phase error; and a radio to communicate over one or more wireless communication frequency channels based at least on the frequency output.

Example 18 includes the subject matter of Example 17, and optionally, wherein the plurality of inverter modules of the first stage are driven by an input to the first stage, the input to the first stage is based on outputs of two or more stages of the plurality of stages of the DCRO.

Example 19 includes the subject matter of Example 18, and optionally, wherein the input to the first stage comprises a weighted combination of the outputs of the two or more stages of the plurality of stages.

Example 20 includes the subject matter of any one of Examples 17-19, and optionally, wherein the plurality of second stages comprises a first subsequent stage immediately subsequent to the first stage according to the cyclic order, and a second subsequent stage separated from the first stage by a predefined number of stages based on the cyclic order.

Example 21 includes the subject matter of Example 20, and optionally, wherein the predefined number of stages comprises an even number of stages.

Example 22 includes the subject matter of Example 20 or 21, and optionally, wherein the plurality of inverter modules of the first stage comprises a first inverter module having an output to drive an input of the first subsequent stage; and a second inverter module having an output to drive an input of the second subsequent stage.

Example 23 includes the subject matter of any one of Examples 17-22, and optionally, wherein a first inverter module of the plurality of inverter modules of the first stage comprises a plurality of inverters connected in parallel, wherein a weight of the first inverter module relative to a second inverter module of the plurality of inverter modules of the first stage is based on a count of activated inverters in the plurality of inverters.

Example 24 includes the subject matter of Example 23, and optionally, wherein the frequency output is based on the weight of the inverter module.

Example 25 includes the subject matter of any one of Examples 17-24, and optionally, wherein the decoder is configured to decode the phase of the DCRO based on a count of the plurality of stages of the DCRO.

Example 26 includes the subject matter of any one of Examples 17-25, and optionally, wherein a period of the DCRO is based on a count of the plurality of stages of the DCRO.

Example 27 includes the subject matter of any one of Examples 17-26, and optionally, wherein the phase error estimator comprises a frequency estimator to generate a phase frequency corresponding to a change in the phase of the DCRO by applying a delay operator to the phase of the DCRO; a subtractor to generate a frequency error by subtracting the phase frequency from the frequency control word; and an accumulator to generate the phase error based on the frequency error.

Example 28 includes the subject matter of any one of Examples 17-27, and optionally, wherein the plurality of stages of the DCRO comprises an odd number of stages.

Example 29 includes the subject matter of any one of Examples 17-28, and optionally, wherein the plurality of stages of the DCRO comprises more than three stages.

Example 30 includes the subject matter of any one of Examples 17-29, and optionally, wherein the plurality of stages of the DCRO comprises more than five stages.

Example 31 includes the subject matter of any one of Examples 17-30, and optionally, wherein the plurality of stages of the DCRO comprises more than ten stages.

Example 32 includes the subject matter of any one of Examples 17-31, and optionally, wherein the digital PLL comprises a fractional-N digital PLL to generate a frequency output as a non-integer multiple of the reference frequency, the sampled phases to be sampled according to the reference frequency.

Example 33 includes a method to be performed at a digital Phase Locked Loop (PLL), the method comprising generating a frequency output of a digitally controlled Ring Oscillator (DCRO) based on a control signal, the DCRO comprising a plurality of stages in a cyclic order, a first stage of the plurality of stages comprising a plurality of inverter modules controlled by the control signal and comprising a plurality of outputs that drive inputs of a plurality of second stages in the plurality of stages; decoding a phase of the DCRO based on a plurality of sampled phases of the plurality of stages of the DCRO; estimating a phase error based on the phase of the DCRO and a frequency control word; and generating the control signal based on the phase error.

Example 34 includes the subject matter of Example 33, and optionally, wherein the plurality of inverter modules of the first stage are driven by an input to the first stage, the input to the first stage is based on outputs of two or more stages of the plurality of stages of the DCRO.

Example 35 includes the subject matter of Example 34, and optionally, wherein the input to the first stage comprises a weighted combination of the outputs of the two or more stages of the plurality of stages.

Example 36 includes the subject matter of any one of Examples 33-35, and optionally, wherein the plurality of second stages comprises a first subsequent stage immediately subsequent to the first stage according to the cyclic order, and a second subsequent stage separated from the first stage by a predefined number of stages based on the cyclic order.

Example 37 includes the subject matter of Example 36, and optionally, wherein the predefined number of stages comprises an even number of stages.

Example 38 includes the subject matter of Example 36 or 37, and optionally, wherein the plurality of inverter modules of the first stage comprises a first inverter module having an output to drive an input of the first subsequent stage; and a second inverter module having an output to drive an input of the second subsequent stage.

Example 39 includes the subject matter of any one of Examples 33-38, and optionally, wherein a first inverter module of the plurality of inverter modules of the first stage comprises a plurality of inverters connected in parallel, wherein a weight of the first inverter module relative to a second inverter module of the plurality of inverter modules of the first stage is based on a count of activated inverters in the plurality of inverters.

Example 40 includes the subject matter of Example 39, and optionally, wherein the frequency output is based on the weight of the inverter module.

Example 41 includes the subject matter of any one of Examples 33-40, and optionally, comprising decoding the phase of the DCRO based on a count of the plurality of stages of the DCRO.

Example 42 includes the subject matter of any one of Examples 33-41, and optionally, wherein a period of the DCRO is based on a count of the plurality of stages of the DCRO.

Example 43 includes the subject matter of any one of Examples 33-42, and optionally, comprising generating a phase frequency corresponding to a change in the phase of the DCRO by applying a delay operator to the phase of the DCRO; generating a frequency error by subtracting the phase frequency from the frequency control word; and generating the phase error based on the frequency error.

Example 44 includes the subject matter of any one of Examples 33-43, and optionally, wherein the plurality of stages of the DCRO comprises an odd number of stages.

Example 45 includes the subject matter of any one of Examples 33-44, and optionally, wherein the plurality of stages of the DCRO comprises more than three stages.

Example 46 includes the subject matter of any one of Examples 33-45, and optionally, wherein the plurality of stages of the DCRO comprises more than five stages.

Example 47 includes the subject matter of any one of Examples 33-46, and optionally, wherein the plurality of stages of the DCRO comprises more than ten stages.

Example 48 includes the subject matter of any one of Examples 33-47, and optionally, comprising generating the frequency output as a non-integer multiple of a reference frequency, the sampled phases to be sampled according to the reference frequency.

Example 49 includes a product comprising one or more tangible computer-readable non-transitory storage media comprising computer-executable instructions operable to, when executed by at least one computer processor, enable the at least one computer processor to implement operations at a digital Phase Locked Loop (PLL), the operations comprising generating a frequency output of a digitally controlled Ring Oscillator (DCRO) based on a control signal, the DCRO comprising a plurality of stages in a cyclic order, a first stage of the plurality of stages comprising a plurality of inverter modules controlled by the control signal and comprising a plurality of outputs that drive inputs of a plurality of second stages in the plurality of stages; decoding a phase of the DCRO based on a plurality of sampled phases of the plurality of stages of the DCRO; estimating a phase error based on the phase of the DCRO and a frequency control word; and generating the control signal based on the phase error.

Example 50 includes the subject matter of Example 49, and optionally, wherein the plurality of inverter modules of the first stage are driven by an input to the first stage, the input to the first stage is based on outputs of two or more stages of the plurality of stages of the DCRO.

Example 51 includes the subject matter of Example 50, and optionally, wherein the input to the first stage comprises a weighted combination of the outputs of the two or more stages of the plurality of stages.

Example 52 includes the subject matter of any one of Examples 49-51, and optionally, wherein the plurality of second stages comprises a first subsequent stage immediately subsequent to the first stage according to the cyclic order, and a second subsequent stage separated from the first stage by a predefined number of stages based on the cyclic order.

Example 53 includes the subject matter of Example 52, and optionally, wherein the predefined number of stages comprises an even number of stages.

Example 54 includes the subject matter of Example 52 or 53, and optionally, wherein the plurality of inverter modules of the first stage comprises a first inverter module having an output to drive an input of the first subsequent stage; and a second inverter module having an output to drive an input of the second subsequent stage.

Example 55 includes the subject matter of any one of Examples 49-54, and optionally, wherein a first inverter module of the plurality of inverter modules of the first stage comprises a plurality of inverters connected in parallel, wherein a weight of the first inverter module relative to a second inverter module of the plurality of inverter modules of the first stage is based on a count of activated inverters in the plurality of inverters.

Example 56 includes the subject matter of Example 55, and optionally, wherein the frequency output is based on the weight of the inverter module.

Example 57 includes the subject matter of any one of Examples 49-56, and optionally, wherein the operations comprise decoding the phase of the DCRO based on a count of the plurality of stages of the DCRO.

Example 58 includes the subject matter of any one of Examples 49-57, and optionally, wherein a period of the DCRO is based on a count of the plurality of stages of the DCRO.

Example 59 includes the subject matter of any one of Examples 49-58, and optionally, wherein the operations comprise generating a phase frequency corresponding to a change in the phase of the DCRO by applying a delay operator to the phase of the DCRO; generating a frequency error by subtracting the phase frequency from the frequency control word; and generating the phase error based on the frequency error.

Example 60 includes the subject matter of any one of Examples 49-59, and optionally, wherein the plurality of stages of the DCRO comprises an odd number of stages.

Example 61 includes the subject matter of any one of Examples 49-60, and optionally, wherein the plurality of stages of the DCRO comprises more than three stages.

Example 62 includes the subject matter of any one of Examples 49-61, and optionally, wherein the plurality of stages of the DCRO comprises more than five stages.

Example 63 includes the subject matter of any one of Examples 49-62, and optionally, wherein the plurality of stages of the DCRO comprises more than ten stages.

Example 64 includes the subject matter of any one of Examples 49-63, and optionally, wherein the operations comprise generating the frequency output as a non-integer multiple of a reference frequency, the sampled phases to be sampled according to the reference frequency.

Example 65 includes an apparatus comprising means for generating a frequency output of a digitally controlled Ring Oscillator (DCRO) based on a control signal, the DCRO comprising a plurality of stages in a cyclic order, a first stage of the plurality of stages comprising a plurality of inverter modules controlled by the control signal and comprising a plurality of outputs that drive inputs of a plurality of second stages in the plurality of stages; decoding a phase of the DCRO based on a plurality of sampled phases of the plurality of stages of the DCRO; means for estimating a phase error based on the phase of the DCRO and a frequency control word; and means for generating the control signal based on the phase error.

Example 66 includes the subject matter of Example 65, and optionally, wherein the plurality of inverter modules of the first stage are driven by an input to the first stage, the input to the first stage is based on outputs of two or more stages of the plurality of stages of the DCRO.

Example 67 includes the subject matter of Example 66, and optionally, wherein the input to the first stage comprises a weighted combination of the outputs of the two or more stages of the plurality of stages.

Example 68 includes the subject matter of any one of Examples 65-67, and optionally, wherein the plurality of second stages comprises a first subsequent stage immediately subsequent to the first stage according to the cyclic order, and a second subsequent stage separated from the first stage by a predefined number of stages based on the cyclic order.

Example 69 includes the subject matter of Example 68, and optionally, wherein the predefined number of stages comprises an even number of stages.

Example 70 includes the subject matter of Example 68 or 69, and optionally, wherein the plurality of inverter modules of the first stage comprises a first inverter module having an output to drive an input of the first subsequent stage; and a second inverter module having an output to drive an input of the second subsequent stage.

Example 71 includes the subject matter of any one of Examples 65-70, and optionally, wherein a first inverter module of the plurality of inverter modules of the first stage comprises a plurality of inverters connected in parallel, wherein a weight of the first inverter module relative to a second inverter module of the plurality of inverter modules of the first stage is based on a count of activated inverters in the plurality of inverters.

Example 72 includes the subject matter of Example 71, and optionally, wherein the frequency output is based on the weight of the inverter module.

Example 73 includes the subject matter of any one of Examples 65-72, and optionally, comprising means for decoding the phase of the DCRO based on a count of the plurality of stages of the DCRO.

Example 74 includes the subject matter of any one of Examples 65-73, and optionally, wherein a period of the DCRO is based on a count of the plurality of stages of the DCRO.

Example 75 includes the subject matter of any one of Examples 65-74, and optionally, comprising means for generating a phase frequency corresponding to a change in the phase of the DCRO by applying a delay operator to the phase of the DCRO; means for generating a frequency error by subtracting the phase frequency from the frequency control word; and means for generating the phase error based on the frequency error.

Example 76 includes the subject matter of any one of Examples 65-75, and optionally, wherein the plurality of stages of the DCRO comprises an odd number of stages.

Example 77 includes the subject matter of any one of Examples 65-76, and optionally, wherein the plurality of stages of the DCRO comprises more than three stages.

Example 78 includes the subject matter of any one of Examples 65-77, and optionally, wherein the plurality of stages of the DCRO comprises more than five stages.

Example 79 includes the subject matter of any one of Examples 65-78, and optionally, wherein the plurality of stages of the DCRO comprises more than ten stages.

Example 80 includes the subject matter of any one of Examples 65-79, and optionally, comprising means for generating the frequency output as a non-integer multiple of a reference frequency, the sampled phases to be sampled according to the reference frequency.

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. A digital Phase Locked Loop (PLL) comprising:
a digitally controlled Ring Oscillator (DCRO) configured to generate a frequency output based on a control signal, the DCRO comprising:
a plurality of stages in a cyclic order, a stage of the plurality of stages comprising:
a plurality of inverter groups controlled by the control signal and comprising a plurality of outputs that drive inputs of a plurality of other stages in the plurality of stages, wherein an inverter group of the plurality of inverter groups of the stage comprises a plurality of inverters connected in parallel;
a decoder to decode a phase of the DCRO based on a plurality of sampled phases of the plurality of stages of the DCRO; and
a phase error estimator to estimate a phase error based on the phase of the DCRO and a frequency control word, the control signal is based on the phase error.

2. The digital PLL of claim 1, wherein the plurality of inverter groups of the stage are driven by an input to the stage, the input to the stage is based on outputs of two or more stages of the plurality of stages of the DCRO.

3. The digital PLL of claim 2, wherein the input to the stage comprises a weighted combination of the outputs of the two or more stages of the plurality of stages.

4. The digital PLL of claim 1, wherein the plurality of other stages comprises a first subsequent stage immediately subsequent to the stage according to the cyclic order, and a second subsequent stage separated from the stage by a predefined number of stages based on the cyclic order.

5. The digital PLL of claim 4, wherein the predefined number of stages comprises an even number of stages.

6. The digital PLL of claim 4, wherein the plurality of inverter groups of the stage comprises a first inverter group having an output to drive an input of the first subsequent stage; and a second inverter group having an output to drive an input of the second subsequent stage.

7. The digital PLL of claim 1, wherein a weight of a first inverter group relative to a second inverter group of the plurality of inverter groups of the stage is based on a count of activated inverters in the first inverter group.

8. The digital PLL of claim 7, wherein the frequency output is based on the weight of the first inverter group.

9. The digital PLL of claim 1, wherein the decoder is configured to decode the phase of the DCRO based on a count of the plurality of stages of the DCRO.

10. The digital PLL of claim 1, wherein a period of the DCRO is based on a count of the plurality of stages of the DCRO.

11. The digital PLL of claim 1, wherein the phase error estimator comprises:
a frequency estimator to generate a phase frequency corresponding to a change in the phase of the DCRO by applying a delay operator to the phase of the DCRO;
a subtractor to generate a frequency error by subtracting the phase frequency from the frequency control word; and
an accumulator to generate the phase error based on the frequency error.

12. The digital PLL of claim 1, wherein the plurality of stages of the DCRO comprises an odd number of stages.

13. The digital PLL of claim 1, wherein the plurality of stages of the DCRO comprises more than three stages.

14. The digital PLL of claim 1, wherein the plurality of stages of the DCRO comprises more than five stages.

15. The digital PLL of claim 1, wherein the plurality of stages of the DCRO comprises more than ten stages.

16. The digital PLL of claim 1 comprising a fractional-N digital PLL to generate the frequency output as a non-integer multiple of a reference frequency, the sampled phases to be sampled according to the reference frequency.

17. A wireless communication device comprising:
one or more antennas;
a digital Phase Locked Loop (PLL) comprising:
a digitally controlled Ring Oscillator (DCRO) configured to generate a frequency output based on a control signal, the DCRO comprising:
a plurality of stages in a cyclic order, a stage of the plurality of stages comprising:
a plurality of inverter groups controlled by the control signal and comprising a plurality of outputs that drive inputs of a plurality of other stages in the plurality of stages, wherein an inverter group of the plurality of inverter groups of the stage comprises a plurality of inverters connected in parallel;
a decoder to decode a phase of the DCRO based on a plurality of sampled phases of the plurality of stages of the DCRO; and
a phase error estimator to estimate a phase error based on the phase of the DCRO and a frequency control word, the control signal is based on the phase error; and
a radio to communicate over one or more wireless communication frequency channels based at least on the frequency output.

18. The wireless communication device of claim 17, wherein the plurality of inverter groups of the stage are driven by an input to the stage, the input to the stage is based on outputs of two or more stages of the plurality of stages of the DCRO.

19. The wireless communication device of claim 18, wherein the input to the stage comprises a weighted combination of the outputs of the two or more stages of the plurality of stages.

20. The wireless communication device of claim 17, wherein the plurality of other stages comprises a first subsequent stage immediately subsequent to the stage according to the cyclic order, and a second subsequent stage separated from the stage by a predefined number of stages based on the cyclic order.

21. The wireless communication device of claim 17, wherein a weight of a first inverter group relative to a second inverter group of the plurality of inverter groups of the stage is based on a count of activated inverters in the first inverter group.

22. The wireless communication device of claim 17, wherein the decoder is configured to decode the phase of the DCRO based on a count of the plurality of stages of the DCRO.

23. A product comprising one or more tangible computer-readable non-transitory storage media comprising computer-executable instructions operable to, when executed by at least one computer processor, enable the at least one computer processor to cause a digital Phase Locked Loop (PLL) to:

generate a frequency output of a digitally controlled Ring Oscillator (DCRO) based on a control signal, the DCRO comprising:
   a plurality of stages in a cyclic order, a stage of the plurality of stages comprising:
     a plurality of inverter groups controlled by the control signal and comprising a plurality of outputs that drive inputs of a plurality of other stages in the plurality of stages, wherein an inverter group of the plurality of inverter groups of the stage comprises a plurality of inverters connected in parallel;

decode a phase of the DCRO based on a plurality of sampled phases of the plurality of stages of the DCRO;

estimate a phase error based on the phase of the DCRO and a frequency control word; and generate the control signal based on the phase error.

24. The product of claim 23, wherein the plurality of inverter groups of the stage are driven by an input to the stage, the input to the stage is based on outputs of two or more stages of the plurality of stages of the DCRO.

25. The product of claim 23, wherein the plurality of other stages comprises a first subsequent stage immediately subsequent to the stage according to the cyclic order, and a second subsequent stage separated from the stage by a predefined number of stages based on the cyclic order.

* * * * *